US010998232B2

(12) United States Patent
Harada et al.

(10) Patent No.: US 10,998,232 B2
(45) Date of Patent: *May 4, 2021

(54) WAFER PROCESSING METHOD OF UNITING A WAFER AND A RING FRAME USING A POLYOLEFIN SHEET

(71) Applicant: DISCO CORPORATION, Tokyo (JP)

(72) Inventors: Shigenori Harada, Tokyo (JP); Minoru Matsuzawa, Tokyo (JP); Hayato Kiuchi, Tokyo (JP); Yoshiaki Yodo, Tokyo (JP); Taro Arakawa, Tokyo (JP); Masamitsu Agari, Tokyo (JP); Emiko Kawamura, Tokyo (JP); Yusuke Fujii, Tokyo (JP); Toshiki Miyai, Tokyo (JP); Makiko Ohmae, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/799,161

(22) Filed: Feb. 24, 2020

(65) Prior Publication Data
US 2020/0286784 A1 Sep. 10, 2020

(30) Foreign Application Priority Data

Mar. 5, 2019 (JP) .............................. JP2019-039204

(51) Int. Cl.
H01L 21/78 (2006.01)
B23K 26/364 (2014.01)
(Continued)

(52) U.S. Cl.
CPC ............ H01L 21/78 (2013.01); B23K 26/364 (2015.10); B23K 26/40 (2013.01); C09J 7/241 (2018.01);
(Continued)

(58) Field of Classification Search
None
See application file for complete search history.

(56) References Cited

U.S. PATENT DOCUMENTS

2005/0221584 A1* 10/2005 Arai .................. H01L 21/02043
438/458
2006/0134406 A1* 6/2006 Horigome .................. C09J 7/29
428/343
(Continued)

FOREIGN PATENT DOCUMENTS

JP 07045556 A 2/1995
JP 2002192370 A 7/2002
(Continued)

OTHER PUBLICATIONS

Harada, Shigenori, U.S. Appl. No. 16/419,126, filed May 22, 2019.
(Continued)

Primary Examiner — Nilufa Rahim
(74) Attorney, Agent, or Firm — Greer Burns & Crain, Ltd.

(57) ABSTRACT

A wafer processing method includes a polyolefin sheet providing step of positioning a wafer in an inside opening of a ring frame and providing a polyolefin sheet on a back side or a front side of the wafer and on a back side of the ring frame, a uniting step of heating the polyolefin sheet as applying a pressure to the polyolefin sheet to thereby unite the wafer and the ring frame through the polyolefin sheet by thermocompression bonding, a dividing step of applying a laser beam to the wafer to form modified layers in the wafer, thereby dividing the wafer into individual device chips, and a pickup step of picking up each device chip from the polyolefin sheet.

9 Claims, 10 Drawing Sheets

(51) Int. Cl.
    *B23K 26/40*     (2014.01)
    *H01L 21/304*     (2006.01)
    *H01L 21/683*     (2006.01)
    *C09J 7/24*     (2018.01)

(52) U.S. Cl.
    CPC ...... *H01L 21/3043* (2013.01); *H01L 21/6836* (2013.01); *H01L 2221/6834* (2013.01); *H01L 2221/68327* (2013.01)

(56) References Cited

U.S. PATENT DOCUMENTS

| | | | | |
|---|---|---|---|---|
| 2008/0182095 | A1* | 7/2008 | Asai | B23K 26/146 428/311.11 |
| 2012/0273831 | A1* | 11/2012 | Suga | H01L 24/83 257/99 |
| 2012/0286429 | A1* | 11/2012 | Han | H01L 24/94 257/774 |
| 2014/0295646 | A1* | 10/2014 | Shinoda | H01L 21/6836 438/464 |
| 2015/0289379 | A1* | 10/2015 | Tuominen | H01L 21/568 174/250 |
| 2016/0007479 | A1* | 1/2016 | Hattori | H01L 21/6836 29/740 |
| 2016/0071767 | A1* | 3/2016 | Hashimoto | H01L 33/0095 257/620 |
| 2018/0151435 | A1* | 5/2018 | Chiang | H01J 37/32715 |
| 2019/0378747 | A1* | 12/2019 | Akutsu | B32B 7/12 |

FOREIGN PATENT DOCUMENTS

| | | | |
|---|---|---|---|
| JP | 2019192717 | A | 10/2019 |
| JP | 2019192718 | A | 10/2019 |

OTHER PUBLICATIONS

Harada, Shigenori, U.S. Appl. No. 16/419,139, filed May 22, 2019.
Harada, Shigenori, U.S. Appl. No. 16/674,276, filed Nov. 5, 2019.
Harada, Shigenori, U.S. Appl. No. 16/401,145, filed May 2, 2019.
Harada, Shigenori, U.S. Appl. No. 16/831,953, filed Mar. 27, 2020.
Harada, Shigenori, U.S. Appl. No. 16/400,209, filed May 1, 2019.
Harada, Shigenori, U.S. Appl. No. 16/598,708, filed Oct. 10, 2019.
Harada, Shigenori, U.S. Appl. No. 16/599,502, filed Oct. 11, 2019.
Harada, Shigenori, U.S. Appl. No. 16/674,203, filed Nov. 5, 2019.
Harada, Shigenori, U.S. Appl. No. 16/799,291, filed Feb. 24, 2020.
Harada, Shigenori, U.S. Appl. No. 16/774,689, filed Jan. 28, 2020.
Harada, Shigenori, U.S. Appl. No. 16/554,928, filed Aug. 29, 2019.
Harada, Shigenori, U.S. Appl. No. 16/752,943, filed Jan. 27, 2020.
Harada, Shigenori, U.S. Appl. No. 16/531,278, filed Aug. 5, 2019.
Harada, Shigenori, U.S. Appl. No. 16/531,341, filed Aug. 5, 2019.
Harada, Shigenori, U.S. Appl. No. 16/453,051, filed Jun. 26, 2019.
Harada, Shigenori, U.S. Appl. No. 16/453,503, filed Jun. 26, 2019.
Harada, Shigenori, U.S. Appl. No. 16/554,914, filed Aug. 29, 2019.
Harada, Shigenori, U.S. Appl. No. 16/704,369, filed Dec. 5, 2019.
Harada, Shigenori, U.S. Appl. No. 16/696,204, filed Nov. 26, 2019.
Harada, Shigenori, U.S. Appl. No. 16/870,353, filed May 8, 2020.
Harada, Shigenori, U.S. Appl. No. 16/870,395, filed May 8, 2020.
Harada, Shigenori, U.S. Appl. No. 16/895,186, filed Jun. 8, 2020.
Harada, Shigenori, U.S. Appl. No. 16/743,137, filed Jan. 15, 2020.
Harada, Shigenori, U.S. Appl. No. 16/743,176, filed Jan. 15, 2020.
Harada, Shigenori, U.S. Appl. No. 16/832,266, filed Mar. 27, 2020.
Harada, Shigenori, U.S. Appl. No. 16/894,108, filed Jun. 5, 2020.
Harada, Shigenori, U.S. Appl. No. 16/916,829, filed Jun. 30, 2020.
Harada, Shigenori, U.S. Appl. No. 16/944,347, filed Jul. 31, 2020.
Harada, Shigenori, U.S. Appl. No. 17/014,572, filed Sep. 8, 2020.
Harada, Shigenori, U.S. Appl. No. 17/063,885, filed Oct. 6, 2020.
Harada, Shigenori, U.S. Appl. No. 17/068,936, filed Oct. 13, 2020.
Harada, Shigenori, U.S. Appl. No. 17/083,526, filed Oct. 29, 2020.
Harada, Shigenori, U.S. Appl. No. 16/916,408, filed Jun. 30, 2020.
Harada, Shigenori, U.S. Appl. No. 16/944,382, filed Jul. 31, 2020.
Harada, Shigenori, U.S. Appl. No. 17/015,360, filed Sep. 9, 2020.
Harada, Shigenori, U.S. Appl. No. 17/063,819, filed Oct. 6, 2020.
Harada, Shigenori, U.S. Appl. No. 17/068,925, filed Oct. 13, 2020.
Harada, Shigenori, U.S. Appl. No. 17/083,552, filed Oct. 29, 2020.
Sekiya, Kazuma, U.S. Appl. No. 16/781,458, filed Feb. 4, 2020.
Search report issued in counterpart Singapore patent application No. 10202001230R, dated Nov. 24, 2020.

* cited by examiner

WAFER PROCESSING METHOD OF UNITING A WAFER AND A RING FRAME USING A POLYOLEFIN SHEET

BACKGROUND OF THE INVENTION

Field of the Invention

The present invention relates to a wafer processing method for dividing a wafer along a plurality of division lines to obtain a plurality of individual device chips, the division lines being formed on the front side of the wafer to thereby define a plurality of separate regions where a plurality of devices are individually formed.

Description of the Related Art

In a fabrication process for device chips to be used in electronic equipment such as mobile phones and personal computers, a plurality of crossing division lines (streets) are first set on the front side of a wafer formed of a semiconductor, for example, thereby defining a plurality of separate regions on the front side of the wafer. In each separate region, a device such as an integrated circuit (IC), a large-scale integrated circuit (LSI), and a light emitting diode (LED) is next formed. Thereafter, a ring frame having an inside opening is prepared, in which an adhesive tape called a dicing tape is previously attached in its peripheral portion to the ring frame so as to close the inside opening of the ring frame. Thereafter, a central portion of the adhesive tape is attached to the back side or the front side of the wafer such that the wafer is accommodated in the inside opening of the ring frame. In this manner, the wafer, the adhesive tape, and the ring frame are united together to form a frame unit. Thereafter, the wafer included in this frame unit is processed to be divided along each division line, thereby obtaining a plurality of individual device chips including the respective devices.

For example, a laser processing apparatus is used to divide the wafer. The laser processing apparatus includes a chuck table for holding the wafer through the adhesive tape and a laser processing unit for focusing a laser beam inside the wafer held on the chuck table, the laser beam having a transmission wavelength to the wafer. In dividing the wafer by using this laser processing apparatus, the frame unit is placed on the chuck table, and the wafer is held through the adhesive tape on the upper surface of the chuck table. In this condition, the chuck table and the laser processing unit are relatively moved in a direction parallel to the upper surface of the chuck table. At the same time, the laser beam is applied from the laser processing unit to the wafer along each division line. When the laser beam is focused inside the wafer, a modified layer serving as a division start point is formed in the wafer along each division line (see Japanese Patent No. 3408805).

Thereafter, the frame unit is transferred from the laser processing apparatus to another apparatus, and the adhesive tape is expanded in a radially outward direction, so that the wafer is divided into individual device chips. When the device chips thus formed are picked up from the adhesive tape, ultraviolet light is applied to the adhesive tape in advance, for example, to thereby reduce the adhesion of the adhesive tape. Thereafter, each device chip is picked up from the adhesive tape. As a processing apparatus capable of producing the device chips with high efficiency, there is a processing apparatus capable of continuously performing the operation for dividing the wafer and the operation for applying ultraviolet light to the adhesive tape (see Japanese Patent No. 3076179, for example).

SUMMARY OF THE INVENTION

The adhesive tape includes a base layer formed from a polyvinyl chloride sheet, for example, and an adhesive layer formed on the base layer. In the laser processing apparatus, the laser beam is focused inside the wafer in order to form a modified layer which serves as a division start point, inside the wafer, and part of leaked light of the laser beam reaches the adhesive layer of the adhesive tape. As a result, the adhesive layer of the adhesive tape attached to the back side or the front side of the wafer is melted by the heat due to the application of the laser beam to the wafer at the position below or around each division groove formed in the wafer, and a part of the adhesive layer melted is fixed to the back side or the front side of each device chip obtained from the wafer. In this case, in the step of picking up each device chip from the adhesive tape, ultraviolet light is applied to the adhesive tape to reduce the adhesion of the adhesive tape. However, the part of the adhesive layer melted and fixed to the back side or the front side of each device chip attached to the adhesive tape is yet left on the back side or the front side of each device chip picked up from the adhesive tape. As a result, the quality of each device chip is degraded.

It is therefore an object of the present invention to provide a wafer processing method which can prevent the adherence of the adhesive layer to the back side or the front side of each device chip obtained from a wafer, thereby suppressing a degradation in quality of each device chip due to the adherence of the adhesive layer.

In accordance with an aspect of the present invention, there is provided a wafer processing method for dividing a wafer along a plurality of division lines to obtain a plurality of individual device chips, the division lines being formed on a front side of the wafer to thereby define a plurality of separate regions where a plurality of devices are individually formed. The wafer processing method includes a ring frame preparing step of preparing a ring frame having an inside opening for accommodating the wafer, a polyolefin sheet providing step of positioning the wafer in the inside opening of the ring frame and providing a polyolefin sheet on a back side or the front side of the wafer and on a back side of the ring frame, a uniting step of heating the polyolefin sheet as applying a pressure to the polyolefin sheet after performing the polyolefin sheet providing step, thereby uniting the wafer and the ring frame through the polyolefin sheet by thermocompression bonding to form a frame unit in a condition where the front side of the wafer and the front side of the ring frame are exposed upward, a dividing step of positioning a focal point of a laser beam inside the wafer, the laser beam having a transmission wavelength to the wafer, and applying the laser beam to the wafer along each division line, thereby forming a modified layer in the wafer along each division line to divide the wafer into the individual device chips, after performing the uniting step, and a pickup step of picking up each device chip from the polyolefin sheet after performing the dividing step.

Preferably, the uniting step includes a step of applying infrared light to the polyolefin sheet, thereby performing the thermocompression bonding.

Preferably, the polyolefin sheet is larger in size than the ring frame, and the uniting step includes an additional step of cutting the polyolefin sheet after heating the polyolefin sheet, thereby removing a part of the polyolefin sheet outside an outer circumference of the ring frame.

Preferably, the pickup step includes a step of expanding the polyolefin sheet to thereby increase a spacing between any adjacent ones of the device chips, and each device chip is pushed up through the polyolefin sheet.

Preferably, the polyolefin sheet is formed of a material selected from the group consisting of polyethylene, polypropylene, and polystyrene.

In the case that the polyolefin sheet is formed of polyethylene, the polyolefin sheet is preferably heated in the range of 120° C. to 140° C. in the uniting step. In the case that the polyolefin sheet is formed of polypropylene, the polyolefin sheet is preferably heated in the range of 160° C. to 180° C. in the uniting step. In the case that the polyolefin sheet is formed of polystyrene, the polyolefin sheet is preferably heated in the range of 220° C. to 240° C. in the uniting step.

Preferably, the wafer is formed of a material selected from the group consisting of silicon, gallium nitride, gallium arsenide, and glass.

In the wafer processing method according to a preferred embodiment of the present invention, the wafer and the ring frame are united by using the polyolefin sheet having no adhesive layer in place of an adhesive tape having an adhesive layer, thereby forming the frame unit composed of the wafer, the ring frame, and the polyolefin sheet united together. The uniting step of uniting the wafer and the ring frame through the polyolefin sheet is realized by thermocompression bonding. After performing the uniting step, a laser beam having a transmission wavelength to the wafer is applied to the wafer to thereby form a modified layer inside the wafer along each division line, so that the wafer is divided along each division line to obtain individual device chips attached to the polyolefin sheet. Thereafter, each device chip is then picked up from the polyolefin sheet. Each device chip picked up is next mounted on a predetermined mounting substrate or the like.

In forming a modified layer inside the wafer, leaked light of the laser beam reaches the polyolefin sheet. However, since the polyolefin sheet has no adhesive layer, there is no problem that the adhesive layer may be melted to be fixed to the back side or the front side of each device chip. That is, according to one aspect of the present invention, the frame unit can be formed by using the polyolefin sheet having no adhesive layer, so that an adhesive tape having an adhesive layer is not required. As a result, it is possible to prevent the problem that the quality of each device chip is degraded by the adherence of the adhesive layer to each device chip.

Thus, the wafer processing method according to one aspect of the present invention can exhibit the effect that the adhesive layer does not adhere to the back side or the front side of each device chip obtained from the wafer, thereby suppressing a degradation in quality of each device chip due to the adherence of the adhesive layer.

The above and other objects, features, and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

Figure 1A:
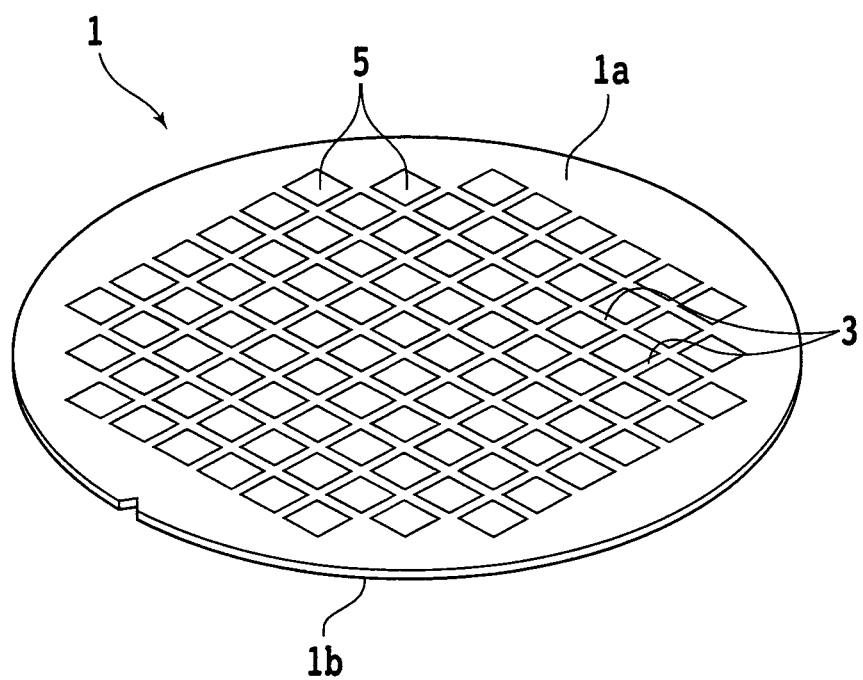
FIG. 1A is a schematic perspective view of the front side of a wafer.
Figure 1B:
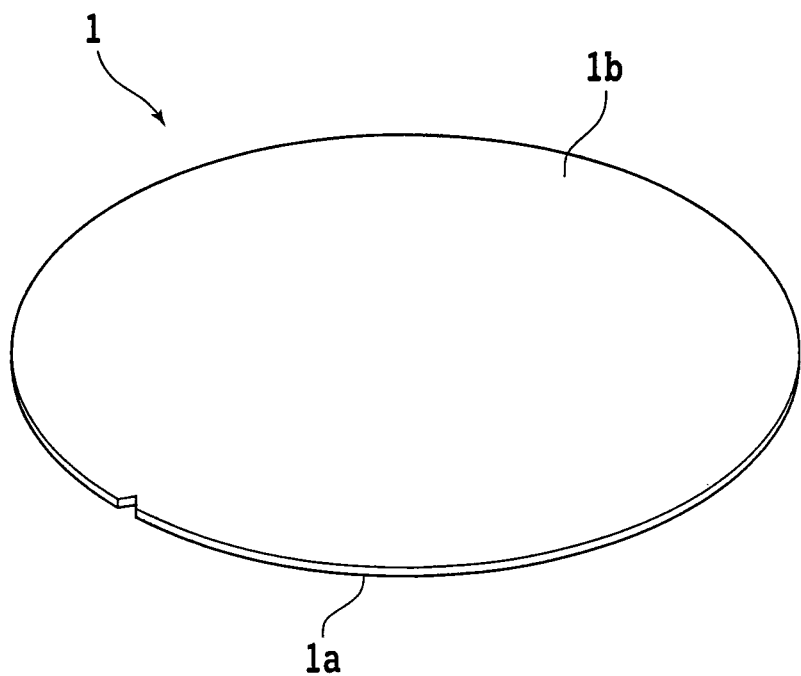
FIG. 1B is a schematic perspective view of the back side of the wafer.

A preferred embodiment of the present invention will now be described with reference to the attached drawings. There will first be described a wafer to be processed by a wafer processing method according to this preferred embodiment. FIG. 1A is a schematic perspective view of the front side of a wafer 1. FIG. 1B is a schematic perspective view of the back side of the wafer. The wafer 1 is a substantially disc-shaped substrate formed of a material such as silicon (Si), silicon carbide (SiC), gallium nitride (GaN), and gallium arsenide (GaAs). The wafer 1 may be formed of any other semiconductor materials. Further, the wafer 1 may be formed of a material such as sapphire, glass, and quartz. Examples of the glass include alkaline glass, nonalkaline glass, soda lime glass, lead glass, borosilicate glass, and silica glass. The wafer 1 has a front side 1a and a back side 1b. A plurality of crossing division lines 3 are formed on the front side 1a of the wafer 1 to thereby define a plurality of respective separate regions where a plurality of devices 5 such as ICs, LSIs, and LEDs are formed. The crossing division lines 3 are composed of a plurality of parallel division lines 3 extending in a first direction and a plurality of parallel division lines 3 extending in a second direction perpendicular to the first direction. In the processing method for the wafer 1 according to this preferred embodiment, a plurality of modified layers are formed inside the wafer along the respective crossing division lines 3 in the wafer 1, thereby dividing the wafer 1 into a plurality of individual device chips each including the device 5 with the modified layers as division start points.

In forming a modified layer in the wafer 1, a laser beam having a transmission wavelength to the wafer 1 is applied to the wafer 1 along each of the division lines 3, thereby focusing the laser beam inside the wafer 1. At this time, the laser beam may be applied to the wafer 1 from the front side 1a depicted in FIG. 1A or from the back side 1b depicted in FIG. 1B. Note that, in a case where the laser beam may be applied to the wafer 1 from the back side 1b, alignment means including an infrared camera is used to detect each of the division lines 3 from the front side 1a through the wafer 1, so that the laser beam is applied to the wafer 1 along each of the division lines 3.

The laser processing to form a modified layer in the wafer 1 is performed by using a laser processing apparatus 12 (see FIG. 8). Prior to loading the wafer 1 into the laser processing apparatus 12, the wafer 1 is united with a polyolefin sheet 9 (see FIG. 3) and a ring frame 7 (see FIG. 2) to thereby form a frame unit 11 (see FIG. 8). Thus, the wafer 1 is loaded in the form of the frame unit 11 into the laser processing apparatus 12 and then processed by the laser processing apparatus 12. Then, the polyolefin sheet 9 is expanded to divide the wafer 1, thereby obtaining the individual device chips, in which each device chip is supported to the polyolefin sheet 9. Thereafter, the polyolefin sheet 9 is further expanded to thereby increase the spacing between any adjacent ones of the device chips. Thereafter, each device chip is picked up by using a pickup apparatus. The ring frame 7 is formed of a rigid material such as metal, and it has a circular inside opening 7a having a diameter larger than that of the wafer 1. The outside shape of the ring frame 7 is substantially circular. The ring frame 7 has a front side 7b and a back side 7c. In forming the frame unit, the wafer 1 is accommodated in the inside opening 7a of the ring frame 7 and positioned in such a manner that the center of the wafer 1 substantially coincides with the center of the inside opening 7a.

The polyolefin sheet 9 is a flexible (expandable) resin sheet, and it has a flat front side and a flat back side. The polyolefin sheet 9 is a circular sheet having a diameter larger than the outer diameter of the ring frame 7. The polyolefin sheet 9 has no adhesive layer. The polyolefin sheet 9 is a sheet of a polymer (polyolefin) synthesized by polymerizing alkene as a monomer. Examples of the polyolefin sheet 9 include a polyethylene sheet, polypropylene sheet, and polystyrene sheet. The polyolefin sheet 9 is transparent or translucent to visible light. As a modification, the polyolefin sheet 9 may be opaque. Since the polyolefin sheet 9 has no adhesive property, it cannot be attached to the wafer 1 and the ring frame 7 at room temperature. However, the polyolefin sheet 9 is a thermoplastic sheet, so that, when the polyolefin sheet 9 is heated to a temperature near its melting point under a predetermined pressure in a condition where the polyolefin sheet 9 is in contact with the wafer 1 and the ring frame 7, the polyolefin sheet 9 is partially melted and thereby bonded to the wafer 1 and the ring frame 7. That is, by applying heat and pressure to the polyolefin sheet 9 in the condition where the polyolefin sheet 9 is in contact with the wafer 1 and the ring frame 7, the polyolefin sheet 9 can be bonded to the wafer 1 and the ring frame 7. Thusly, in the processing method for the wafer 1 according to this preferred embodiment, all of the wafer 1, the ring frame 7, and the polyolefin sheet 9 are united by thermocompression bonding as mentioned above, thereby forming the frame unit.

Figure 2:
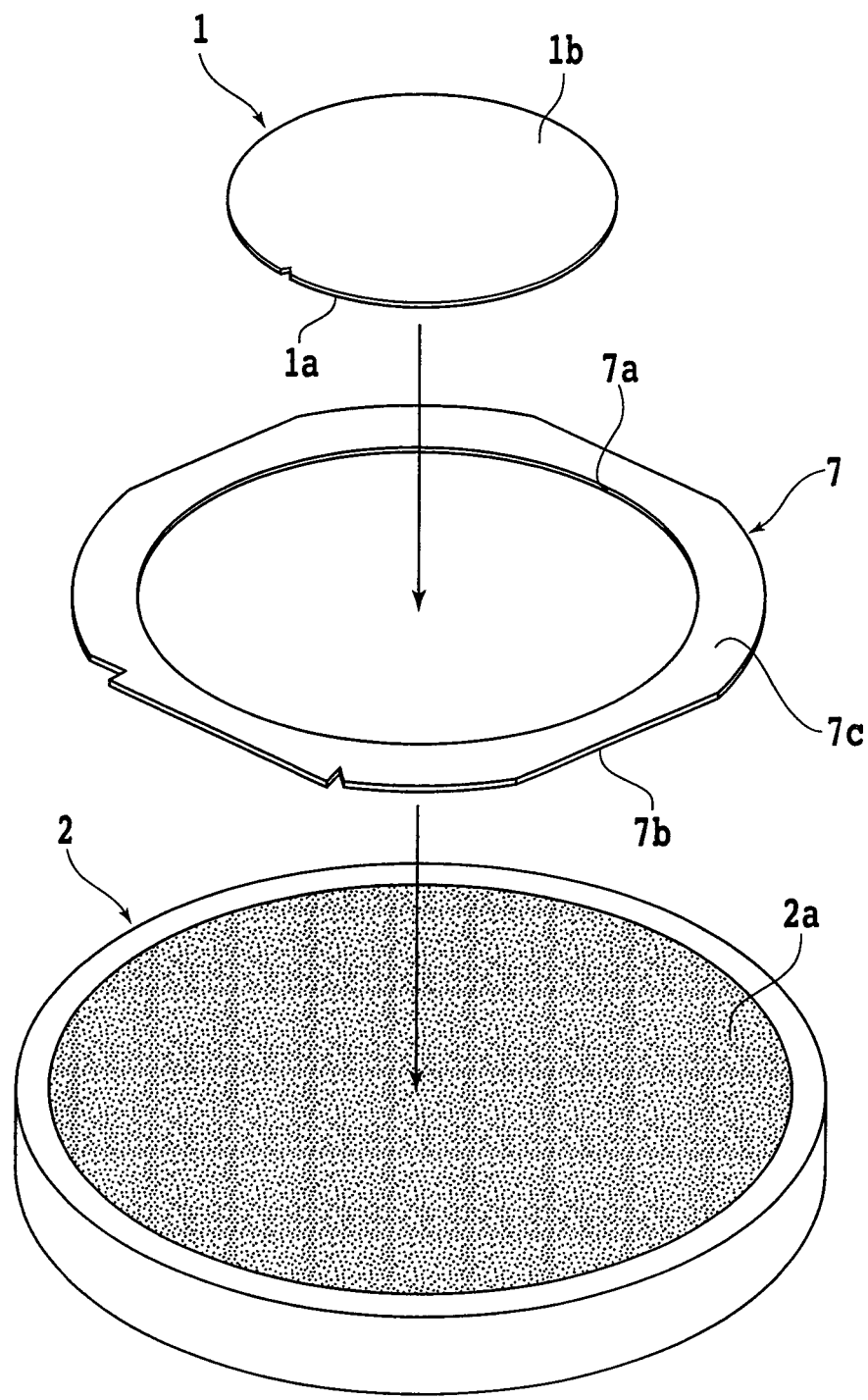
FIG. 2 is a schematic perspective view depicting a manner of positioning the wafer and a ring frame on a holding surface of a chuck table.

The steps of the processing method for the wafer 1 according to this preferred embodiment will now be described. Prior to uniting the wafer 1, the polyolefin sheet 9, and the ring frame 7, a polyolefin sheet providing step is performed by using a chuck table 2 having a holding surface 2a depicted in FIG. 2. FIG. 2 is a schematic perspective view depicting a manner of positioning the wafer 1 and the ring frame 7 on the holding surface 2a of the chuck table 2. That is, the polyolefin sheet providing step is performed on the holding surface 2a of the chuck table 2 as depicted in FIG. 2. The chuck table 2 has a circular porous member having a diameter larger than the outer diameter of the ring frame 7. The porous member constitutes a central upper portion of the chuck table 2. The porous member has an upper surface functioning as the holding surface 2a of the chuck table 2. A suction passage (not depicted) is formed in the chuck table 2, in which one end of the suction passage is connected to the porous member. Further, a vacuum source 2b (see FIG. 3) is connected to the other end of the suction passage. The suction passage is provided with a selector 2c (see FIG. 3) for switching between an ON condition and an OFF condition. When the ON condition is established by the selector 2c, a vacuum produced by the vacuum source 2b is applied to a workpiece placed on the holding surface 2a of the chuck table 2, thereby holding the workpiece on the chuck table 2 under suction.

In the polyolefin sheet providing step, the wafer 1 and the ring frame 7 are first placed on the holding surface 2a of the chuck table 2 as depicted in FIG. 2. In this condition, the wafer 1 is positioned in the inside opening 7a of the ring frame 7. At this time, taking it into consideration which of the front side 1a or the back side 1b is to be an application surface to be applied by the laser beam in the later dividing step, an orientation of the wafer 1 is selected. For example, in a case where the front side 1a is selected as the application surface, the front side 1a is orientated downward. Alternatively, for example, in a case where the back side 1b is selected as the application surface, the back side 1b is orientated downward. A wafer processing method according to the preferred embodiment will be described below taking the case where the front side 1a is selected as the application surface of the laser beam as an example. However, the orientation of the wafer 1 is not limited to this.

Figure 3:
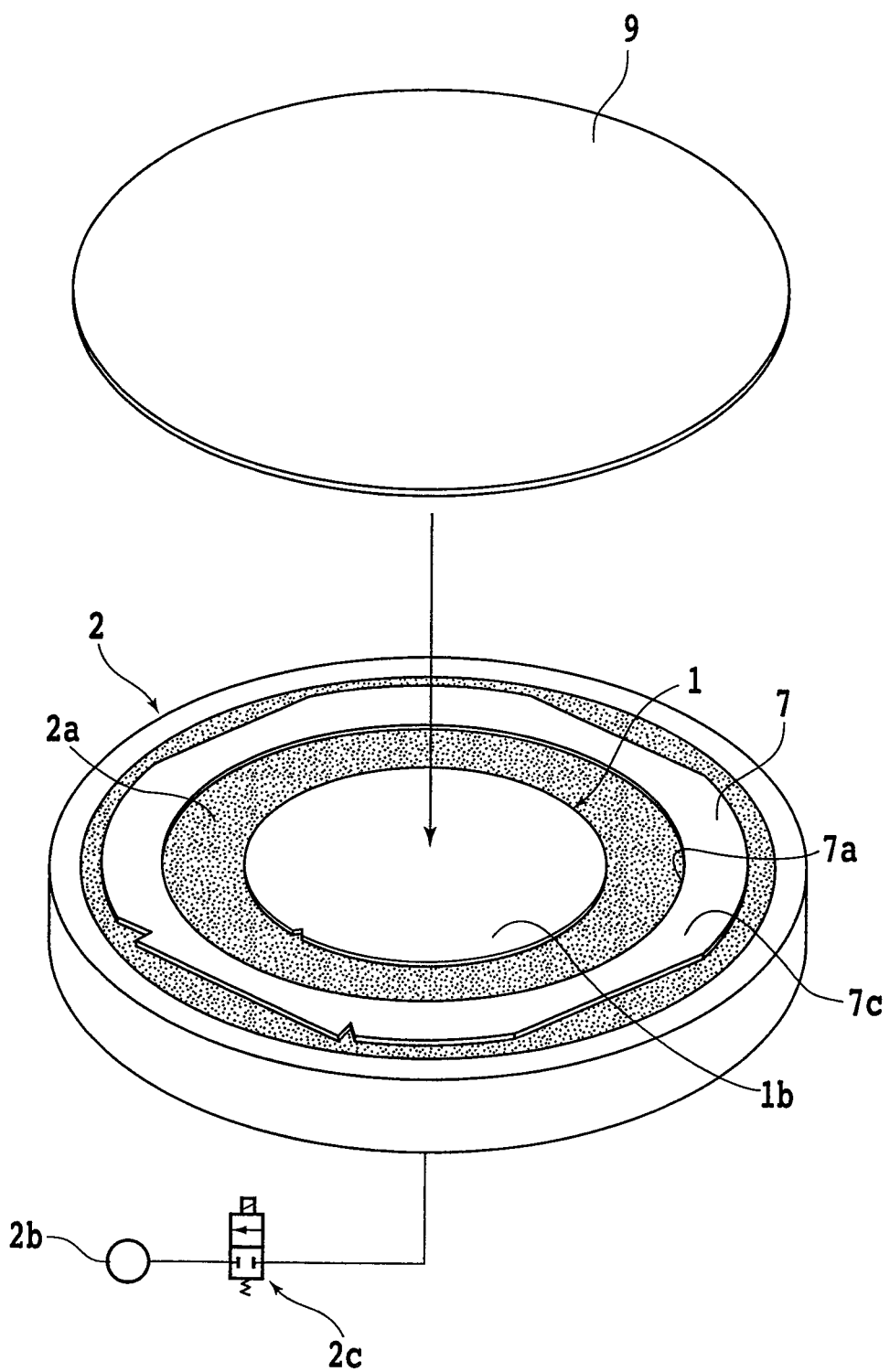
FIG. 3 is a schematic perspective view depicting a polyolefin sheet providing step.

After the wafer 1 and the frame 7 are placed on the holding surface 2a of the chuck table 2, the polyolefin sheet 9 is provided on the back side 1b (or the front side 1a) (upper surface) of the wafer 1 and on the back side 7c (upper surface) of the ring frame 7. FIG. 3 is a schematic perspective view depicting a manner of providing the polyolefin sheet 9 on the wafer 1 and the ring frame 7. That is, as depicted in FIG. 3, the polyolefin sheet 9 is provided so as to fully cover the wafer 1 and the ring frame 7. In the polyolefin sheet providing step, the diameter of the polyolefin sheet 9 is set larger than the diameter of the holding surface 2a of the chuck table 2. Unless the diameter of the polyolefin sheet 9 is larger than the diameter of the holding surface 2a, there may arise a problem such that, when the vacuum from the vacuum source 2b is applied to the holding surface 2a of the chuck table 2 in a uniting step to be performed later, the vacuum may leak from any gap between the polyolefin sheet 9 and the holding surface 2a because the holding surface 2a is not fully covered with the polyolefin sheet 9, so that a pressure cannot be properly applied to the polyolefin sheet 9.

Figure 4:
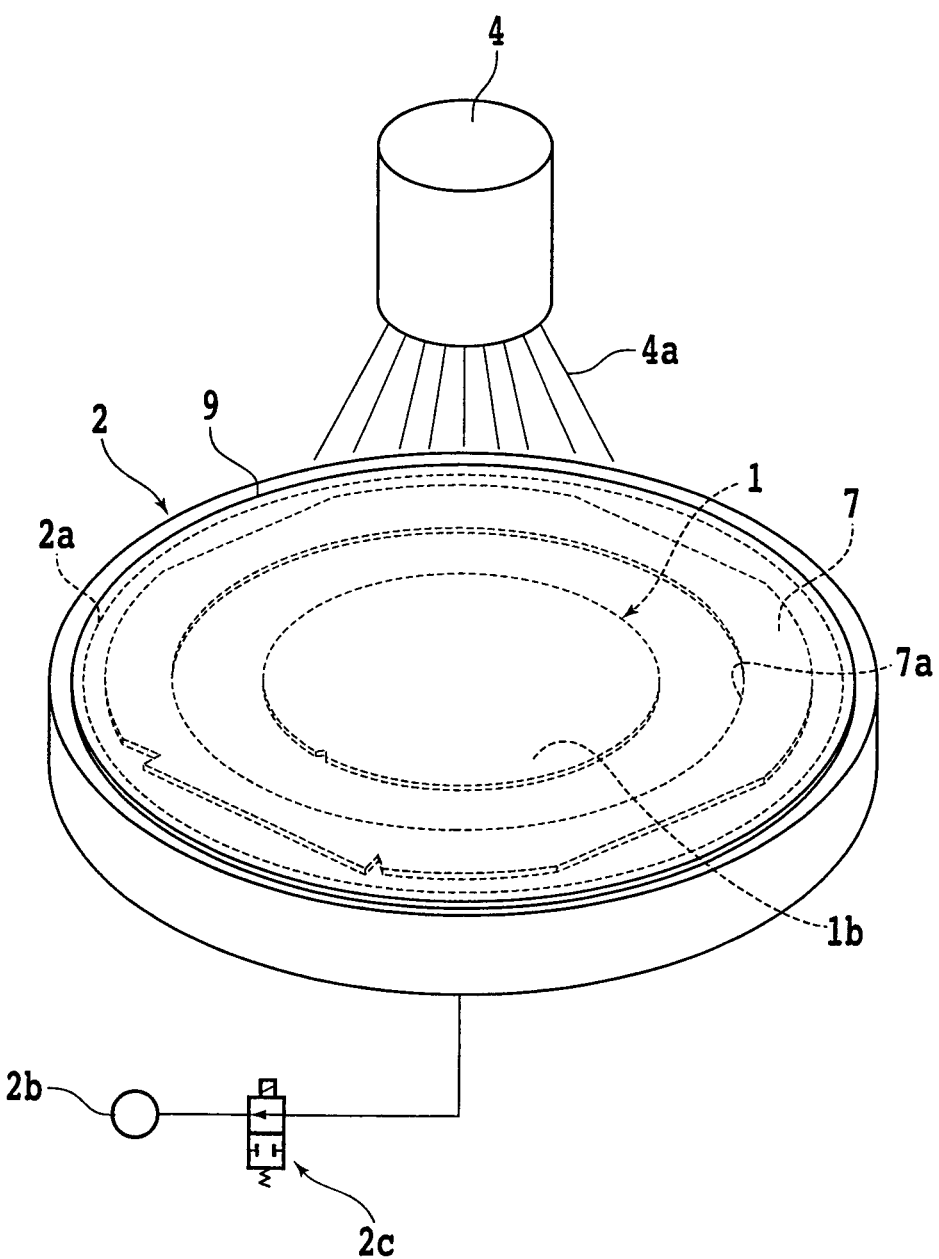
FIG. 4 is a schematic perspective view depicting a uniting step.

In the processing method for the wafer 1 according to this preferred embodiment, a uniting step is next performed in such a manner that the polyolefin sheet 9 is heated to unite the wafer 1 and the ring frame 7 through the polyolefin sheet 9 by thermocompression bonding. FIG. 4 is a schematic perspective view depicting the uniting step according to this preferred embodiment. As depicted in FIG. 4, the polyolefin sheet 9 transparent or translucent to visible light is provided so as to fully cover the wafer 1, the ring frame 7, and the holding surface 2a of the chuck table 2, which are all depicted by broken lines in FIG. 4. In the uniting step, the selector 2c is operated to establish the ON condition where the vacuum source 2b is in communication with the porous member of the chuck table 2, i.e., the holding surface 2a of the chuck table 2, so that a vacuum produced by the vacuum source 2b is applied to the polyolefin sheet 9 provided on the chuck table 2. Accordingly, the polyolefin sheet 9 is brought into close contact with the wafer 1 and the ring frame 7 by the atmospheric pressure applied to the upper surface of the polyolefin sheet 9.

Thereafter, the polyolefin sheet 9 is heated in a condition where the polyolefin sheet 9 is sucked by the vacuum source 2b, thereby performing thermocompression bonding. In this preferred embodiment depicted in FIG. 4, for example, the heating of the polyolefin sheet 9 is effected by a heat gun 4 provided above the chuck table 2. The heat gun 4 includes heating means such as a heating wire and an air blowing mechanism such as a fan. Accordingly, the heat gun 4 can heat ambient air and blow the heated air. In a condition where the vacuum from the vacuum source 2b is applied to the polyolefin sheet 9, the heat gun 4 is operated to supply hot air 4a to the upper surface of the polyolefin sheet 9. Accordingly, when the polyolefin sheet 9 is heated to a predetermined temperature, the polyolefin sheet 9 is bonded to the wafer 1 and the ring frame 7 by thermocompression bonding.

Figure 5:
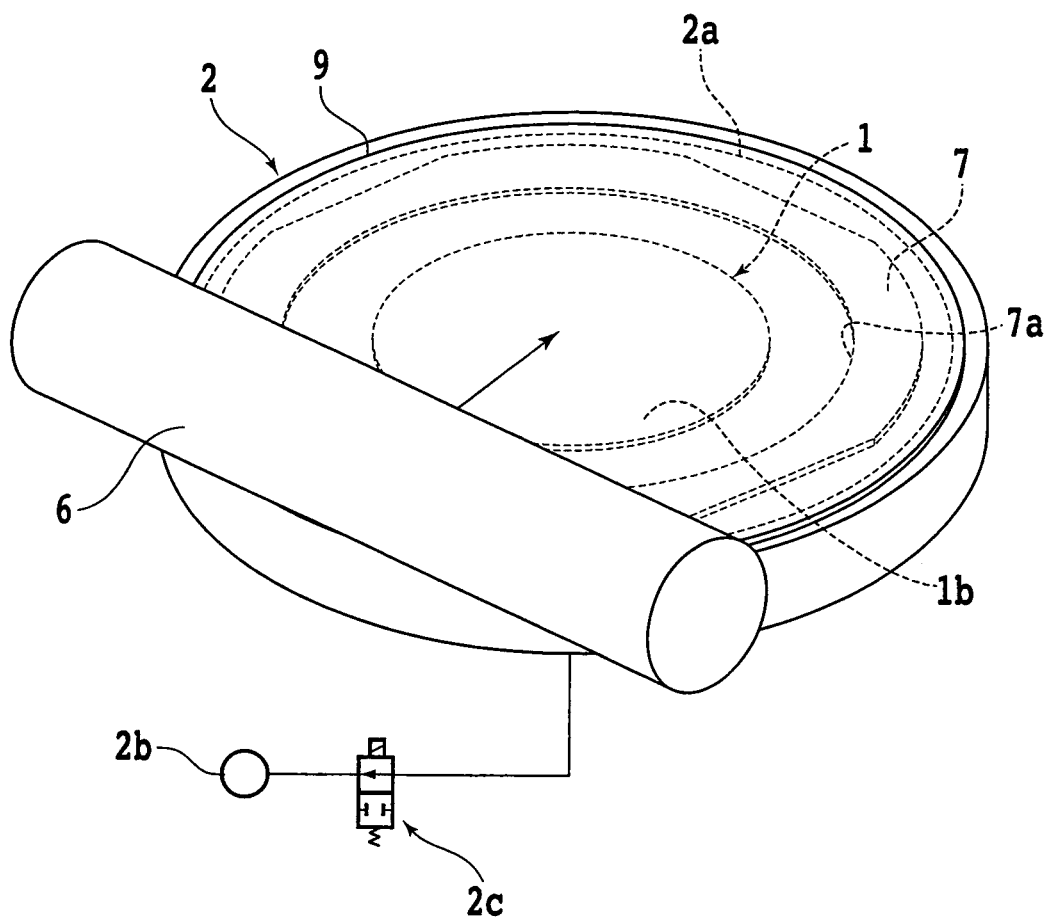
FIG. 5 is a schematic perspective view depicting a modification of the uniting step.

Another method for heating the polyolefin sheet 9 may be adopted. For example, any member heated to a predetermined temperature may be pressed on the polyolefin sheet 9 against the wafer 1 and the ring frame 7. FIG. 5 is a schematic perspective view depicting such a modification of the uniting step. As depicted in FIG. 5, the polyolefin sheet 9 transparent or translucent to visible light is provided so as to fully cover the wafer 1, the ring frame 7, and the holding surface 2a of the chuck table 2, which are all depicted by broken lines in FIG. 5. In this modification depicted in FIG. 5, a heat roller 6 including a heat source is used. More specifically, the vacuum produced by the vacuum source 2b is first applied to the polyolefin sheet 9, so that the polyolefin sheet 9 is brought into close contact with the wafer 1 and the ring frame 7 by the atmospheric pressure applied to the upper surface of the polyolefin sheet 9.

Thereafter, the heat roller 6 is heated to a predetermined temperature, and next placed on the holding surface 2a of the chuck table 2 at one end lying on the outer circumference of the holding surface 2a as depicted in FIG. 5. Thereafter, the heat roller 6 is rotated about its axis to roll on the chuck table 2 through the polyolefin sheet 9 from the above one end to another end diametrically opposite to the above one end. As a result, the polyolefin sheet 9 is bonded to the wafer 1 and the ring frame 7 by thermocompression bonding. In the case that a force for pressing the polyolefin sheet 9 is applied by the heat roller 6, the thermocompression bonding is effected at a pressure higher than atmospheric pressure. Preferably, a cylindrical surface of the heat roller 6 is coated with fluororesin. Further, the heat roller 6 may be replaced by any iron-like pressure member having a flat base plate and containing a heat source. In this case, the pressure member is heated to a predetermined temperature to thereby provide a hot plate, which is next pressed on the polyolefin sheet 9 held on the chuck table 2.

Figure 6:
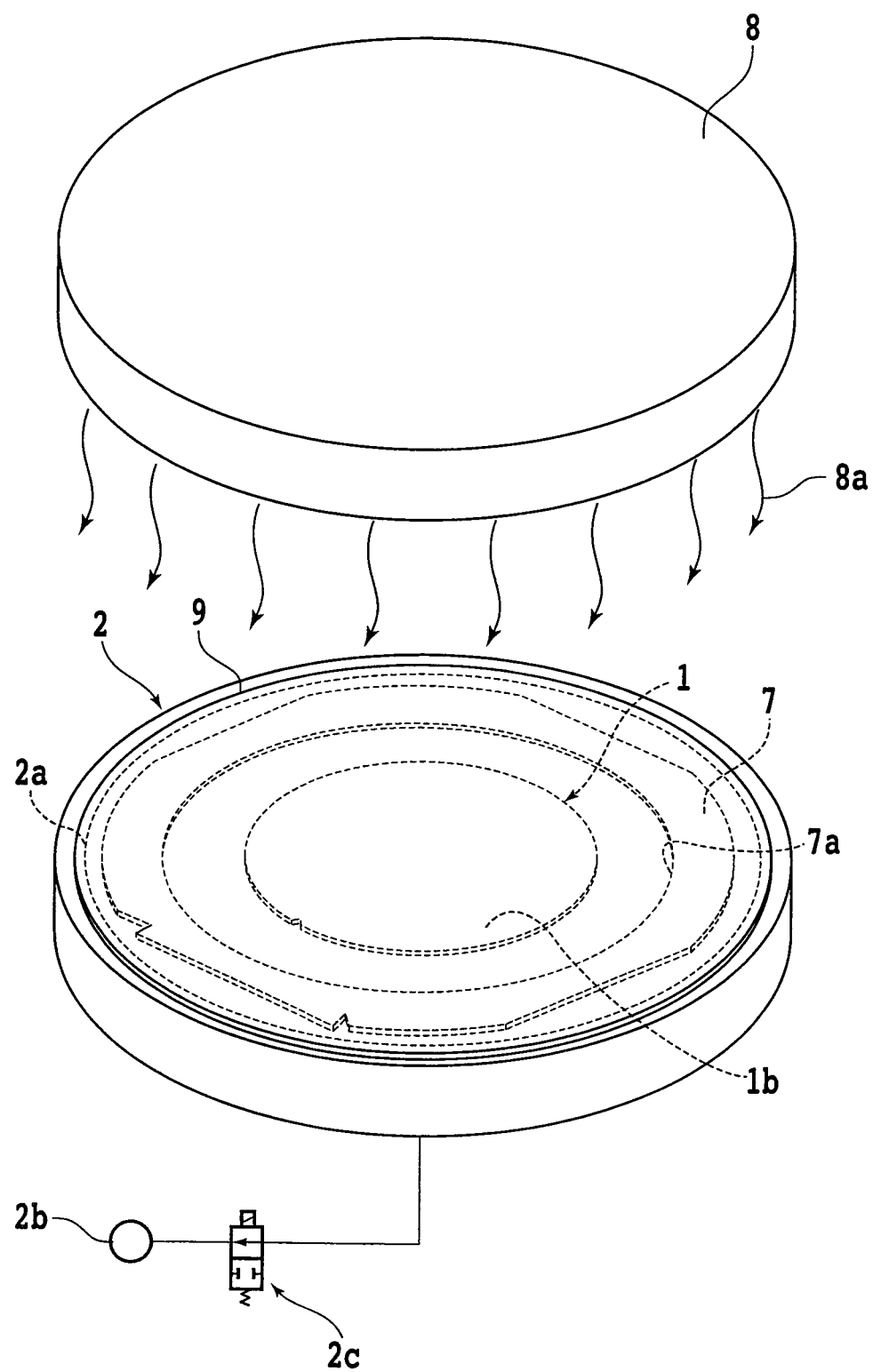
FIG. 6 is a schematic perspective view depicting another modification of the uniting step.

Still another method for heating the polyolefin sheet 9 may be adopted in the following manner. FIG. 6 is a schematic perspective view depicting such another modification of the uniting step. As depicted in FIG. 6, the polyolefin sheet 9 transparent or translucent to visible light is provided so as to fully cover the wafer 1, the ring frame 7, and the holding surface 2a of the chuck table 2, which are all depicted by broken lines in FIG. 6. In this modification depicted in FIG. 6, an infrared lamp 8 is provided above the chuck table 2 to heat the polyolefin sheet 9. The infrared lamp 8 can apply infrared light 8a having an absorption wavelength to at least the material of the polyolefin sheet 9. Also in the modification depicted in FIG. 6, the vacuum produced by the vacuum source 2b is first applied to the polyolefin sheet 9, so that the polyolefin sheet 9 is brought into close contact with the wafer 1 and the ring frame 7 by the atmospheric pressure applied to the upper surface of the polyolefin sheet 9. Thereafter, the infrared lamp 8 is operated to apply the infrared light 8a to the polyolefin sheet 9, thereby heating the polyolefin sheet 9. As a result, the polyolefin sheet 9 is bonded to the wafer 1 and the ring frame 7 by thermocompression bonding.

When the polyolefin sheet 9 is heated to a temperature near its melting point by performing any one of the above methods, the polyolefin sheet 9 is bonded to the wafer 1 and the ring frame 7 by thermocompression bonding. After bonding the polyolefin sheet 9, the selector 2c is operated to establish the OFF condition where the communication between the porous member of the chuck table 2 and the vacuum source 2b is canceled. Accordingly, the suction holding by the chuck table 2 is canceled.

Figure 7A:
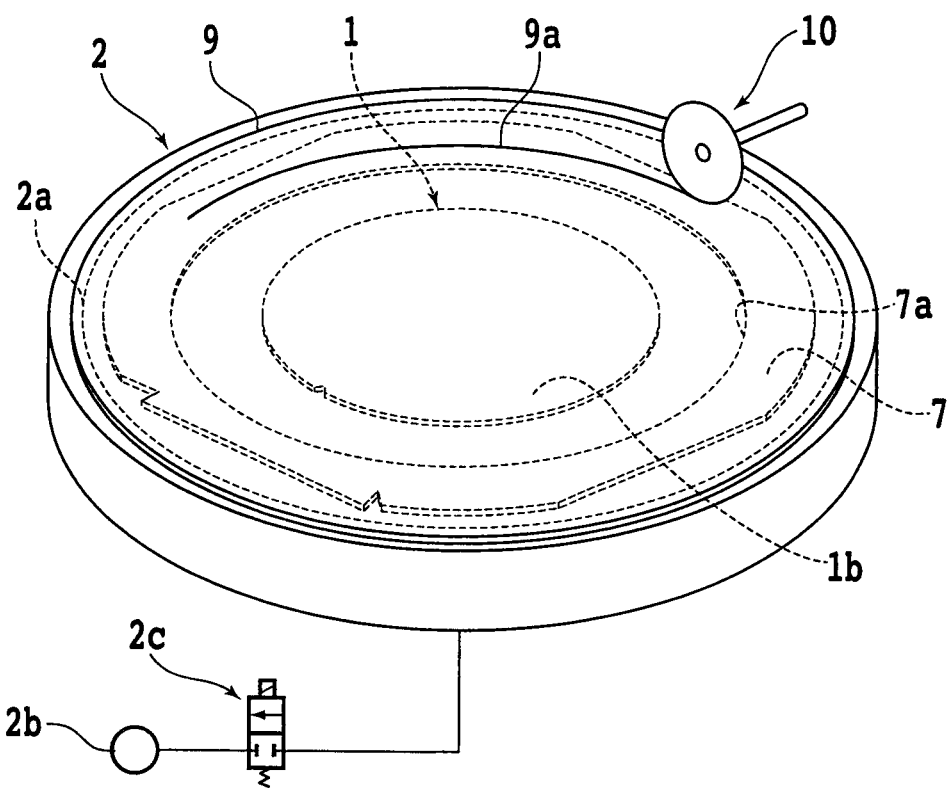
FIG. 7A is a schematic perspective view depicting a manner of cutting the polyolefin sheet after performing the uniting step.

Thereafter, the polyolefin sheet 9 is circularly cut along the outer circumference of the ring frame 7 to remove an unwanted peripheral portion of the polyolefin sheet 9. FIG. 7A is a schematic perspective view depicting a manner of cutting the polyolefin sheet 9. As depicted in FIG. 7A, a disc-shaped (annular) cutter 10 is used to cut the polyolefin sheet 9. The cutter 10 has a central through hole 10a in which a rotating shaft 10b is fitted. Accordingly, the cutter 10 is rotatable about the axis of the rotating shaft 10b. First, the cutter 10 is positioned above the ring frame 7. At this time, the rotating shaft 10b is set so as to extend in the radial direction of the chuck table 2. Thereafter, the cutter 10 is lowered until the outer circumference (cutting edge) of the cutter 10 comes into contact with the polyolefin sheet 9 placed on the ring frame 7. That is, the polyolefin sheet 9 is caught between the cutter 10 and the ring frame 7, so that the polyolefin sheet 9 is cut by the cutter 10 to form a cut mark 9a. Further, the cutter 10 is rolled on the polyolefin sheet 9 along a circular line set between the inner circumference of the ring frame 7 (i.e., the periphery of the inside opening 7a of the ring frame 7) and the outer circumference of the ring frame 7, thereby circularly forming the cut mark 9a along the above circular line. As a result, a predetermined central portion of the polyolefin sheet 9 is surrounded by the circular cut mark 9a. Thereafter, a remaining peripheral portion of the polyolefin sheet 9 outside the circular cut mark 9a is removed. That is, an unwanted peripheral portion of the polyolefin sheet 9 including an outermost peripheral portion outside the outer circumference of the ring frame 7 can be removed.

Figure 7B:
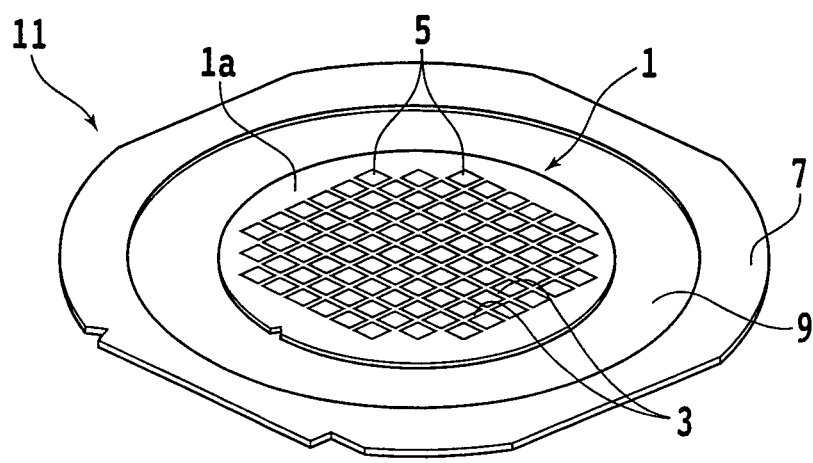
FIG. 7B is a schematic perspective view of a frame unit formed by performing the step depicted in FIG. 7A.

The cutter 10 may be replaced by an ultrasonic cutter for cutting the polyolefin sheet 9. Further, a vibration source for vibrating the cutter 10 at a frequency in an ultrasonic band may be connected to the cutter 10. Further, in cutting the polyolefin sheet 9, the polyolefin sheet 9 may be cooled to be hardened in order to facilitate the cutting operation. By cutting the polyolefin sheet 9 as mentioned above, a frame unit 11 depicted in FIG. 7B is formed, in which the frame unit 11 is composed of the wafer 1, the ring frame 7, and the polyolefin sheet 9 united together. That is, the wafer 1 and the ring frame 7 are united with each other through the polyolefin sheet 9 to form the frame unit 11 as depicted in FIG. 7B. FIG. 7B is a schematic perspective view of the frame unit 11 in a condition where the front side 1a of the wafer 1 and the front side 7b of the ring frame 7 are exposed upward.

In performing the thermocompression bonding as mentioned above, the polyolefin sheet 9 is heated preferably to a temperature lower than or equal to the melting point of the polyolefin sheet 9. If the heating temperature is higher than the melting point of the polyolefin sheet 9, there is a possibility that the polyolefin sheet 9 may be melted to such an extent that the shape of the polyolefin sheet 9 cannot be maintained. Further, the polyolefin sheet 9 is heated preferably to a temperature higher than or equal to the softening point of the polyolefin sheet 9. If the heating temperature is lower than the softening point of the polyolefin sheet 9, the thermocompression bonding cannot be properly performed. Accordingly, the polyolefin sheet 9 is heated preferably to a temperature higher than or equal to the softening point of the polyolefin sheet 9 and lower than or equal to the melting point of the polyolefin sheet 9. Further, there is a case that the softening point of the polyolefin sheet 9 may be unclear. To cope with such a case, in performing the thermocompression bonding, the polyolefin sheet 9 is heated preferably to a temperature higher than or equal to a preset temperature and lower than or equal to the melting point of the polyolefin sheet 9, the preset temperature being lower by 20° C. than the melting point of the polyolefin sheet 9.

In the case that the polyolefin sheet 9 is a polyethylene sheet, the heating temperature in the uniting step is preferably set in the range of 120° C. to 140° C. Further, in the case that the polyolefin sheet 9 is a polypropylene sheet, the heating temperature in the uniting step is preferably set in the range of 160° C. to 180° C. Further, in the case that the polyolefin sheet 9 is a polystyrene sheet, the heating temperature in the uniting step is preferably set in the range of 220° C. to 240° C.

The heating temperature is defined herein as the temperature of the polyolefin sheet 9 to be heated in performing the uniting step. As the heat sources included in the heat gun 4, the heat roller 6, and the infrared lamp 8 mentioned above, some kind of heat source capable of setting an output temperature has been put into practical use. However, even when such a heat source is used to heat the polyolefin sheet 9, the temperature of the polyolefin sheet 9 does not reach the output temperature set above in some case. To cope with such a case, the output temperature of the heat source may be set to a temperature higher than the melting point of the polyolefin sheet 9 in order to heat the polyolefin sheet 9 to a predetermined temperature.

Figure 8A:
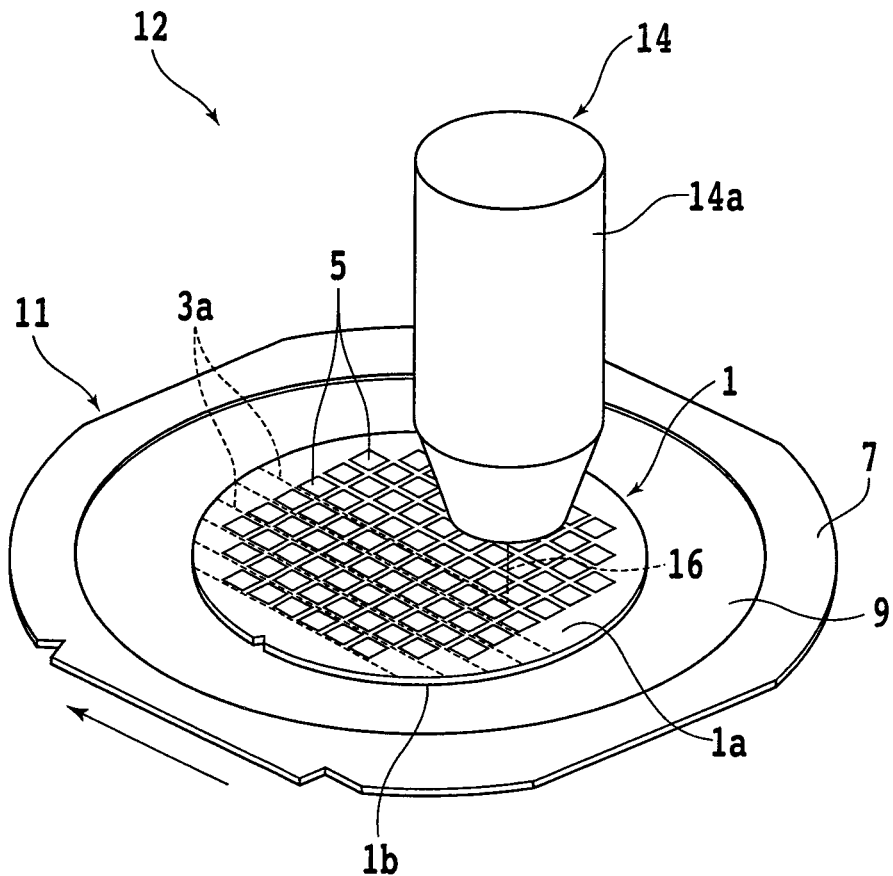
FIG. 8A is a schematic perspective view depicting a dividing step.
Figure 8B:
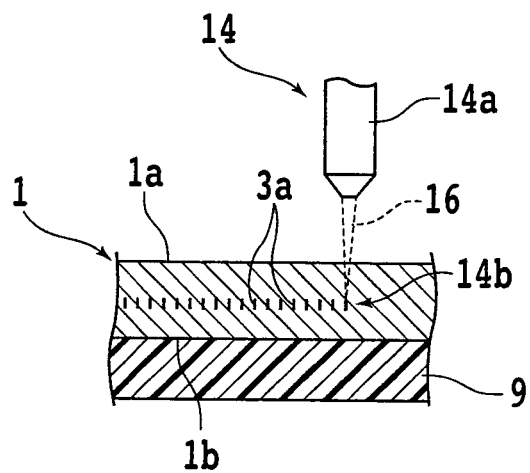
FIG. 8B is a schematic sectional view depicting the dividing step.

After performing the uniting step mentioned above, a dividing step is performed in such a manner that the wafer 1 in the condition of the frame unit 11 is processed by a laser beam to form a plurality of modified layers inside the wafer 1 along the plural crossing division lines 3, thereby dividing the wafer 1 into individual device chips. The dividing step is performed by using a laser processing apparatus 12 depicted in FIG. 8A in this preferred embodiment. FIG. 8A is a schematic perspective view depicting the dividing step. FIG. 8B is a schematic sectional view depicting the dividing step. As depicted in FIG. 8A, the laser processing apparatus 12 includes a laser processing unit 14 for applying a laser beam 16 to the wafer 1 and a chuck table (not depicted) for holding the wafer 1. The laser processing unit 14 includes a laser oscillator (not depicted) for generating the laser beam 16 having a transmission wavelength to the wafer 1 (having a wavelength transmittable to the wafer 1). The chuck table has an upper surface as a holding surface for holding the wafer 1. The chuck table is movable in a direction parallel to the upper surface thereof, that is, movable in a feeding direction. The laser beam 16 generated from the laser oscillator in the laser processing unit 14 is applied to the wafer 1 held on the chuck table. The laser processing unit 14 further includes a processing head 14a having a mechanism for positioning a focal point 14b of the laser beam 16 at a predetermined vertical position inside the wafer 1.

In performing laser processing to the wafer 1, the frame unit 11 is placed on the chuck table in the condition where the front side 1a of the wafer 1 is exposed upward. Accordingly, the wafer 1 is held through the polyolefin sheet 9 on the chuck table. Thereafter, the chuck table is rotated to make the division lines 3 extending in the first direction on the front side 1a of the wafer 1 parallel to a feeding direction in the laser processing apparatus 12. Further, the chuck table and the laser processing unit 14 are relatively moved to adjust a relative position, thereby positioning the processing head 14a directly above an extension of a predetermined one of the division lines 3 extending in the first direction. Thereafter, the focal point 14b of the laser beam 16 is positioned at a predetermined vertical position. Thereafter, the laser beam 16 is applied from the laser processing unit 14 inside the wafer 1. At the same time, the chuck table and the laser processing unit 14 are relatively moved in the feeding direction parallel to the upper surface of the chuck table. Specifically, the focal point 14b of the laser beam 16 is positioned inside the wafer 1, and the laser beam 16 is applied to the wafer 1 along the predetermined division lines 3. As a result, the modified layer 3a is formed inside the wafer 1. Note that, in FIG. 8A, the modified layer 3a formed inside the wafer 1 is depicted with broken lines. Accordingly, a division groove 3a is formed in the wafer 1 along the predetermined division line 3 by the laser beam 16. The division groove 3a has a depth from the front side 1a to the back side 1b of the wafer 1. In this dividing step, the laser beam 16 may be applied under the following processing conditions. The following processing conditions are merely illustrative.

Wavelength: 1064 nm
    Repetition frequency: 50 kHz
    Average power: 1 W
    Feed speed: 200 mm/s After forming the modified layer 3a inside the wafer 1 along the predetermined division line 3, the chuck table and the laser processing unit 14 are moved in an indexing direction perpendicular to the feeding direction to similarly perform laser processing along the next division line 3 extending in the first direction. Thereafter, laser processing is similarly performed along all of the other division lines 3 extending in the first direction. Thus, a plurality of similar modified layers 3a are formed along all of the division lines 3 extending in the first direction. Thereafter, the chuck table is rotated 90 degrees about its vertical axis perpendicular to the holding surface thereof to similarly perform laser processing along all of the division lines 3 extending in the second direction perpendicular to the first direction. Thus, a plurality of similar modified layers 3a are formed along all of the division lines 3 extending in the second direction.

When the laser beam 16 is focused inside the wafer 1 by the laser processing unit 14 to form the modified layer 3a, leaked light of the laser beam 16 reaches the polyolefin sheet 9 below the wafer 1. For example, in a case where the frame unit 11 adopts an adhesive tape instead of the polyolefin sheet 9, when the leaked light of the laser beam 16 is applied to an adhesive layer of the adhesive tape, the adhesive layer of the adhesive tape is melted, so that part of the adhesive layer is fixed to the back side 1b of the wafer 1. In this case, the part of the adhesive layer is left on the back side of each of the device chips formed by dividing the wafer 1. As a result, a degradation in quality of each device chip is caused. In contrast, in the wafer processing method according to the present embodiment, the polyolefin sheet 9 having no adhesive layer is used in the frame unit 11. Accordingly, even if the leaked light of the laser beam 16 reaches the polyolefin sheet 9, the adhesive layer is not fixed to the back side 1b of the wafer 1. Thus, quality of each device chip formed from the wafer 1 is favorably maintained.

Figure 9:
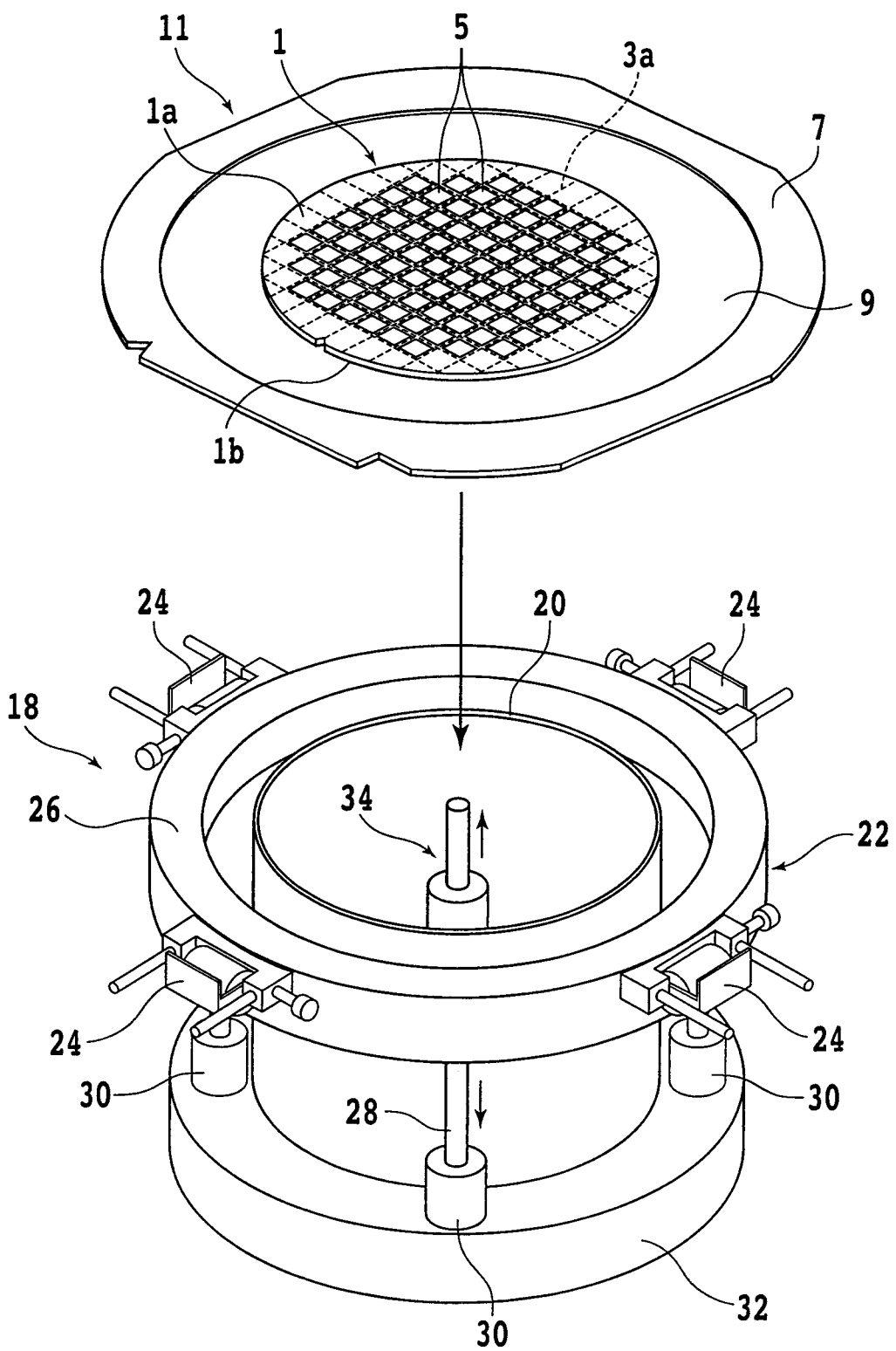
FIG. 9 is a schematic perspective view depicting a manner of loading the frame unit to a pickup apparatus after performing the dividing step.

Next, the polyolefin sheet 9 is expanded in a radially outward direction, so that the wafer 1 is divided into individual device chips. After performing the dividing step, a pickup step is performed to pick up each device chip from the polyolefin sheet 9. Expansion of the polyolefin sheet 9 is performed by using a pickup apparatus 18 depicted in a lower portion of FIG. 9. FIG. 9 is a schematic perspective view depicting a manner of loading the frame unit 11 to the pickup apparatus 18. As depicted in FIG. 9, the pickup apparatus 18 includes a cylindrical drum 20 and a frame holding unit 22 having a frame support table 26 provided around the cylindrical drum 20. The cylindrical drum 20 has an inner diameter larger than the diameter of the wafer 1 and an outer diameter smaller than the inner diameter of the ring frame 7 (the diameter of the inside opening 7a). The frame support table 26 of the frame holding unit 22 is an annular table having a circular inside opening larger in diameter than the drum 20. That is, the frame support table 26 has an inner diameter larger than the outer diameter of the drum 20. Further, the frame support table 26 has an outer diameter larger than the outer diameter of the ring frame 7. The inner diameter of the frame support table 26 is substantially equal to the inner diameter of the ring frame 7. The frame support table 26 has an upper surface as a supporting surface for supporting the ring frame 7 thereon through the polyolefin sheet 9. Initially, the height of the upper surface of the frame support table 26 is set equal to the height of the upper end of the drum 20 (see FIG. 10A). Further, the upper end portion of the drum 20 is surrounded by the inner circumference of the ring frame 7 in this initial stage.

A plurality of clamps 24 are provided on the outer circumference of the frame support table 26. Each clamp 24 functions to hold the ring frame 7 supported on the frame support table 26. That is, when the ring frame 7 of the frame unit 11 is placed through the polyolefin sheet 9 on the frame support table 26 and then held by each clamp 24, the frame unit 11 can be fixed to the frame support table 26. The frame support table 26 is supported by a plurality of rods 28 extending in a vertical direction. That is, each rod 28 is connected at its upper end to the lower surface of the frame support table 26. An air cylinder 30 for vertically moving each rod 28 is connected to the lower end of each rod 28. More specifically, the lower end of each rod 28 is connected to a piston (not depicted) movably accommodated in the air cylinder 30. Each air cylinder 30 is supported to a disc-shaped base 32. That is, the lower end of each air cylinder 30 is connected to the upper surface of the disc-shaped base 32. Accordingly, when each air cylinder 30 is operated in the initial stage, the frame support table 26 is lowered with respect to the drum 20 fixed in position.

Further, a pushup mechanism 34 for pushing up each device chip supported to the polyolefin sheet 9 is provided inside the drum 20. Further, a collet 36 (see FIG. 10B) capable of holding each device chip under suction is provided above the drum 20. Both the pushup mechanism 34 and the collet 36 are movable in a horizontal direction parallel to the upper surface of the frame support table 26. The collet 36 is connected through a selector 36b (see FIG. 10B) to a vacuum source 36a (see FIG. 10B).

Figure 10A:
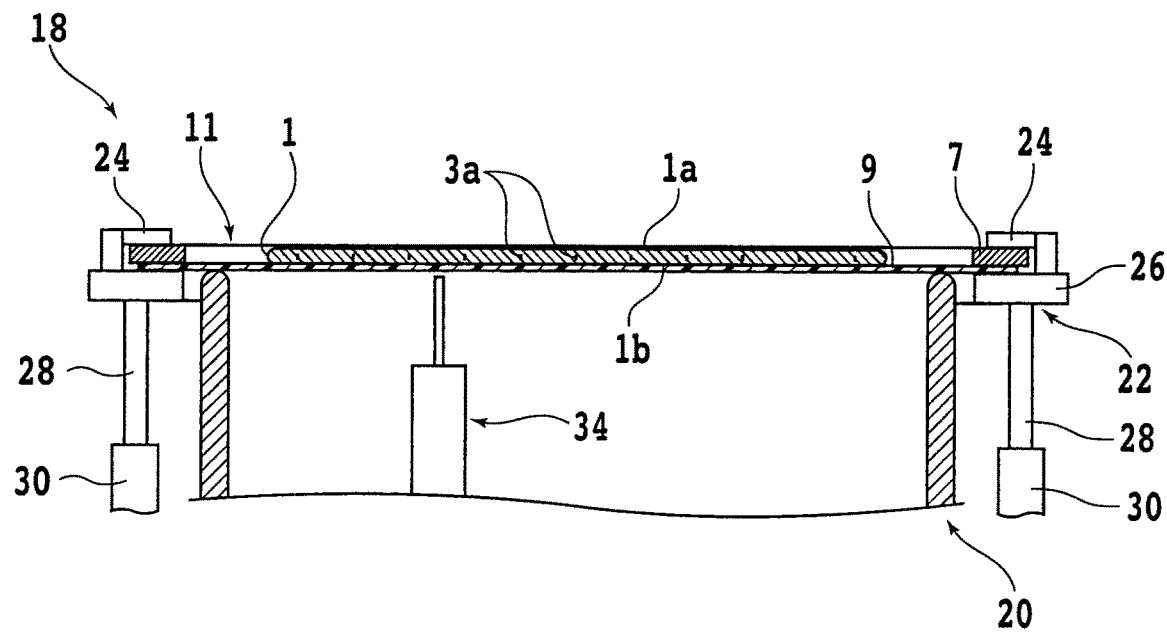
FIG. 10A is a schematic sectional view depicting a standby condition where the frame unit is fixed to a frame support table set at an initial position in a pickup step using the pickup apparatus depicted in FIG. 9.

In expanding the polyolefin sheet 9, each air cylinder 30 in the pickup apparatus 18 is first operated to adjust the height of the frame support table 26 such that the height of the upper end of the drum 20 becomes equal to the height of the upper surface of the frame support table 26. Thereafter, the frame unit 11 transferred from the laser processing apparatus 12 is placed on the drum 20 and the frame support table 26 in the pickup apparatus 18 in a condition where the front side 1a of the wafer 1 of the frame unit 11 is oriented upward. Thereafter, each clamp 24 is operated to fix the ring frame 7 of the frame unit 11 to the upper surface of the frame support table 26. FIG. 10A is a schematic sectional view depicting a standby condition where the frame unit 11 is fixed to the frame support table 26 set at the initial position. At this time, the plural modified layers 3a have already been formed inside the wafer 1 along the division lines 3.

Figure 10B:
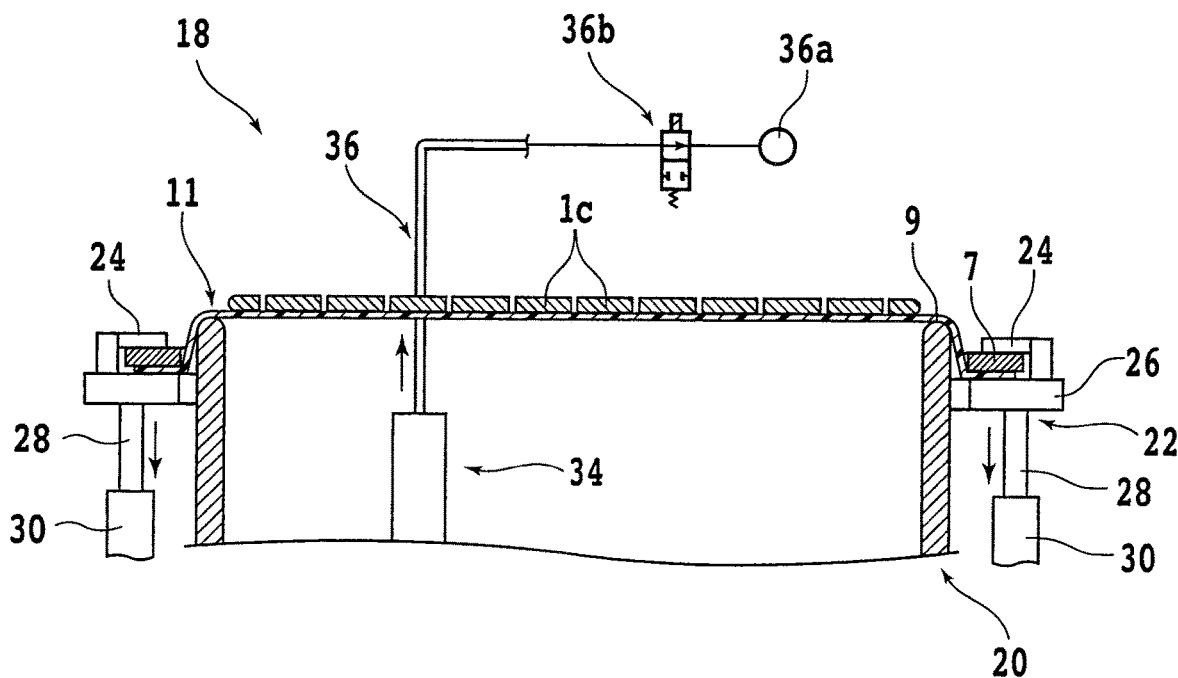
FIG. 10B is a schematic sectional view depicting a working condition where the frame support table holding the frame unit with the polyolefin sheet is lowered to expand the polyolefin sheet in the pickup step.

Thereafter, each air cylinder 30 is operated to lower the frame support table 26 of the frame holding unit 22 with respect to the drum 20. As a result, the polyolefin sheet 9 fixed to the frame holding unit 22 by each clamp 24 is expanded radially outward as depicted in FIG. 10B. FIG. 10B is a schematic sectional view depicting the expanded polyolefin sheet 9. When the polyolefin sheet 9 is expanded, a force toward a radially outward direction is applied to the wafer 1, and the wafer 1 is divided with the modified layers 3a as a start point, thereby forming individual device chips 1c. When the polyolefin sheet 9 is further expanded, the spacing between any adjacent ones of the device chips 1c supported to the polyolefin sheet 9 is increased as depicted in FIG. 10B. Accordingly, each device chip 1c can be easily picked up.

In the wafer processing method according to the present embodiment, after the wafer 1 is divided into individual device chips 1c, a pickup step of picking up the device chips 1c from the polyolefin sheet 9 is performed. In the pickup step, a target one of the device chips 1c is decided, and the pushup mechanism 34 is next moved to a position directly below this target device chip 1c as depicted in FIG. 10B. Furthermore, the collet 36 is also moved to a position directly above this target device chip 1c as depicted in FIG. 10B. Thereafter, the pushup mechanism 34 is operated to push up the target device chip 1c through the polyolefin sheet 9. Further, the selector 36b is operated to make the collet 36 communicate with the vacuum source 36a. As a result, the target device chip 1c is held under suction by the collet 36 and thereby picked up from the polyolefin sheet 9. Such a pickup operation is similarly performed for all the other device chips 1c. Thereafter, each device chip 1c picked up is mounted on a predetermined wiring substrate or the like for actual use.

In the case of forming the frame unit 11 by using an adhesive tape, the leaked light of the laser beam 16 applied to the wafer 1 reaches the adhesive tape in the dividing step, so that the adhesive layer of the adhesive tape is melted and fixed to the back side of each device chip. Accordingly, in this case, there is a problem that the adherence of the adhesive layer to each device chip causes a degradation in quality. To the contrary, in the wafer processing method according to this preferred embodiment, the frame unit 11 can be formed by using the polyolefin sheet 9 having no adhesive layer, in which the polyolefin sheet 9 is attached to the wafer 1 and the ring frame 7 by thermocompression bonding. That is, an adhesive tape having an adhesive layer is not required. As a result, it is possible to prevent a degradation in quality of each device chip due to the adherence of the adhesive layer to the back side of each device chip.

The present invention is not limited to the above preferred embodiment, but various modifications may be made within the scope of the present invention. For example, while the polyolefin sheet 9 is selected from a polyethylene sheet, a polypropylene sheet, and a polystyrene sheet in the above preferred embodiment, this is merely illustrative. That is, the polyolefin sheet usable in the present invention may be formed of any other materials (polyolefins) such as a copolymer of propylene and ethylene and an olefin elastomer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer along a plurality of division lines to obtain a plurality of individual device chips, the division lines being formed on a front side of the wafer to thereby define a plurality of separate regions where a plurality of devices are individually formed, the wafer processing method comprising:
    a ring frame preparing step of preparing a ring frame having an inside opening for accommodating the wafer;
    a polyolefin sheet providing step of positioning the wafer in the inside opening of the ring frame and providing a polyolefin sheet having no adhesive layer on a back side or the front side of the wafer and on a back side of the ring frame, such that the polyolefin sheet is in direct contact with the front side of the wafer or the back side of the wafer and the back side of the ring frame;
    a uniting step of heating the polyolefin sheet having no adhesive layer while applying a pressure to the polyolefin sheet after performing the polyolefin sheet providing step, thereby uniting the wafer and the ring frame through the polyolefin sheet by thermocompression bonding to form a frame unit in a condition where the wafer and the ring frame are exposed;
    a dividing step of positioning a focal point of a laser beam inside the wafer, the laser beam having a transmission wavelength to the wafer, and applying the laser beam to the wafer along each division line, thereby forming a modified layer in the wafer along each division line to divide the wafer into the individual device chips, after performing the uniting step; and
    a pickup step of picking up each device chip from the polyolefin sheet after performing the dividing step.

2. The wafer processing method according to claim 1, wherein the uniting step includes a step of applying infrared light to the polyolefin sheet, thereby performing the thermocompression bonding.

3. The wafer processing method according to claim 1, wherein the polyolefin sheet is larger in size than the ring frame, and the uniting step includes an additional step of cutting the polyolefin sheet after heating the polyolefin sheet, thereby removing a part of the polyolefin sheet outside an outer circumference of the ring frame.

4. The wafer processing method according to claim 1, wherein the pickup step includes a step of expanding the polyolefin sheet to thereby increase a spacing between any adjacent ones of the device chips, and each device chip is pushed up through the polyolefin sheet.

5. The wafer processing method according to claim 1, wherein the polyolefin sheet is formed of a material selected from the group consisting of polyethylene, polypropylene, and polystyrene.

6. The wafer processing method according to claim 5, wherein the polyolefin sheet is formed of polyethylene, and the polyolefin sheet is heated in the range of 120° C. to 140° C. in the uniting step.

7. The wafer processing method according to claim 5, wherein the polyolefin sheet is formed of polypropylene, and the polyolefin sheet is heated in the range of 160° C. to 180° C. in the uniting step.

8. The wafer processing method according to claim 5, wherein the polyolefin sheet is formed of polystyrene, and the polyolefin sheet is heated in the range of 220° C. to 240° C. in the uniting step.

9. The wafer processing method according to claim 1, wherein the wafer is formed of a material selected from the group consisting of silicon, gallium nitride, gallium arsenide, and glass.

* * * * *